(12) United States Patent
Imai

(10) Patent No.: US 8,125,359 B2
(45) Date of Patent: Feb. 28, 2012

(54) ANALOG-TO-DIGITAL CONVERTER

(75) Inventor: Shigeo Imai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 12/819,561

(22) Filed: Jun. 21, 2010

(65) Prior Publication Data

US 2010/0328123 A1    Dec. 30, 2010

(30) Foreign Application Priority Data

Jun. 24, 2009 (JP) .................................. 2009-150167

(51) Int. Cl.
*H03M 1/06* (2006.01)

(52) U.S. Cl. ........ 341/118; 341/120; 341/131; 341/141; 341/142; 341/155

(58) Field of Classification Search .................. 341/118, 341/120, 131, 141, 142, 155, 159
See application file for complete search history.

(56) References Cited

U.S. PATENT DOCUMENTS

| | | | | |
|---|---|---|---|---|
| 5,150,120 | A * | 9/1992 | Yunus | 341/143 |
| 7,312,734 | B2 | 12/2007 | McNeill et al. | |
| 7,336,729 | B2 * | 2/2008 | Agazzi | 375/316 |
| 7,352,316 | B2 * | 4/2008 | Hori et al. | 341/155 |
| 7,457,538 | B2 * | 11/2008 | Strawczynski et al. | 398/33 |
| 7,870,415 | B2 * | 1/2011 | Kummaraguntla et al. | 713/503 |
| 7,898,446 | B2 * | 3/2011 | Nagarajan et al. | 341/118 |
| 7,940,199 | B2 * | 5/2011 | Chen et al. | 341/120 |
| 2001/0052864 | A1 * | 12/2001 | Shimizu et al. | 341/141 |
| 2007/0120724 | A1 * | 5/2007 | Hori et al. | 341/156 |
| 2008/0024338 | A1 * | 1/2008 | Huang et al. | 341/120 |
| 2010/0103009 | A1 * | 4/2010 | Imai | 341/122 |
| 2011/0102228 | A1 * | 5/2011 | Anthony et al. | 341/155 |
| 2011/0115661 | A1 * | 5/2011 | Steensgaard-Madsen | 341/155 |

FOREIGN PATENT DOCUMENTS

JP    11-122505    4/1999

OTHER PUBLICATIONS

Black, Time Interleaved Converter Arrays, IEEE Journal of Solid-State Circuits, vol. Sc-15, No. 6, Dec. 1980.

* cited by examiner

*Primary Examiner* — Linh Nguyen
(74) *Attorney, Agent, or Firm* — Turocy & Watson, LLP

(57) ABSTRACT

According to an embodiment, an analog-to-digital converter (ADC) including an ADC unit, a clock-phase control unit, a multiplexer, and a digital-output processing unit is provided. The digital-output processing unit inputs digital outputs of the ADC unit to either an averaging circuit or the multiplexer depending on the specified conversion speed and the specified conversion accuracy, or inputs the digital outputs of the ADC unit to the averaging circuit and the multiplexer in this order, and outputs ADC digital signals with the specified conversion speed and the specified conversion accuracy.

12 Claims, 5 Drawing Sheets

ANALOG-TO-DIGITAL CONVERTER

CROSS-REFERENCE TO RELATED APPLICATION

This application is based upon and claims the benefit of priority from Japanese Patent Application No. 2009-150157, filed on Jun. 24, 2009; the entire contents of which are incorporated herein by reference.

FIELD

Embodiments described herein relate generally to an analog-to-digital converter.

BACKGROUND

Analog-to-digital converters (hereinafter, abbreviated as "ADCs") have been used in various technical fields. However, conversion speed and conversion accuracy (SNR) required in specification of the ADCs are not uniform. For example, in wireless communication systems used in digital mobile-phone services, various modulation methods are employed, and the conversion speed and the conversion accuracy required in ADCs for demodulation vary depending on the modulation methods.

In one example, while an ADC that performs demodulation in the Wideband Code Division Multiple Access (W-CDMA) system is required to have combined specification of relatively-high conversion speed and relatively-low conversion accuracy (SNR), an ADC that performs demodulation in a digital mobile telephony system standardized particularly in Europe (Global System for Mobile communication: GSM)) is required to have combined specification of relatively-low conversion speed and relatively-high conversion accuracy (SNR).

However, conventional ADCs have been independently developed on a case-by-case basis depending on required specification. Therefore, there is a problem in that development periods and development costs are increased.

DETAILED DESCRIPTION

In general, according to one embodiment, an analog-to-digital converter (ADC) including an ADC unit, a clock-phase control unit, a multiplexer, and a digital-output processing unit is provided. The ADC unit includes a plurality of base ADCs that convert input analog signals to digital signals in parallel. The clock-control unit controls phases of clocks supplied to the plurality of base ADCs according to specified conversion speed and specified conversion accuracy. The multiplexer outputs an averaging circuit that obtains average data of input digital signals and input digital signals in a predetermined order at a predetermined interval. The digital-output processing unit inputs digital outputs of the ADC unit to either the averaging circuit or the multiplexer depending on the specified conversion speed and the specified conversion accuracy, or inputs the digital outputs of the ADC unit to the averaging circuit and the multiplexer in this order, and outputs ADC digital signals with the specified conversion speed and the specified conversion accuracy.

Exemplary embodiments of an analog-to-digital converter (ADC) will be explained in detail below with reference to the accompanying drawings. The present invention is not limited to the following embodiments.

Figure 1:
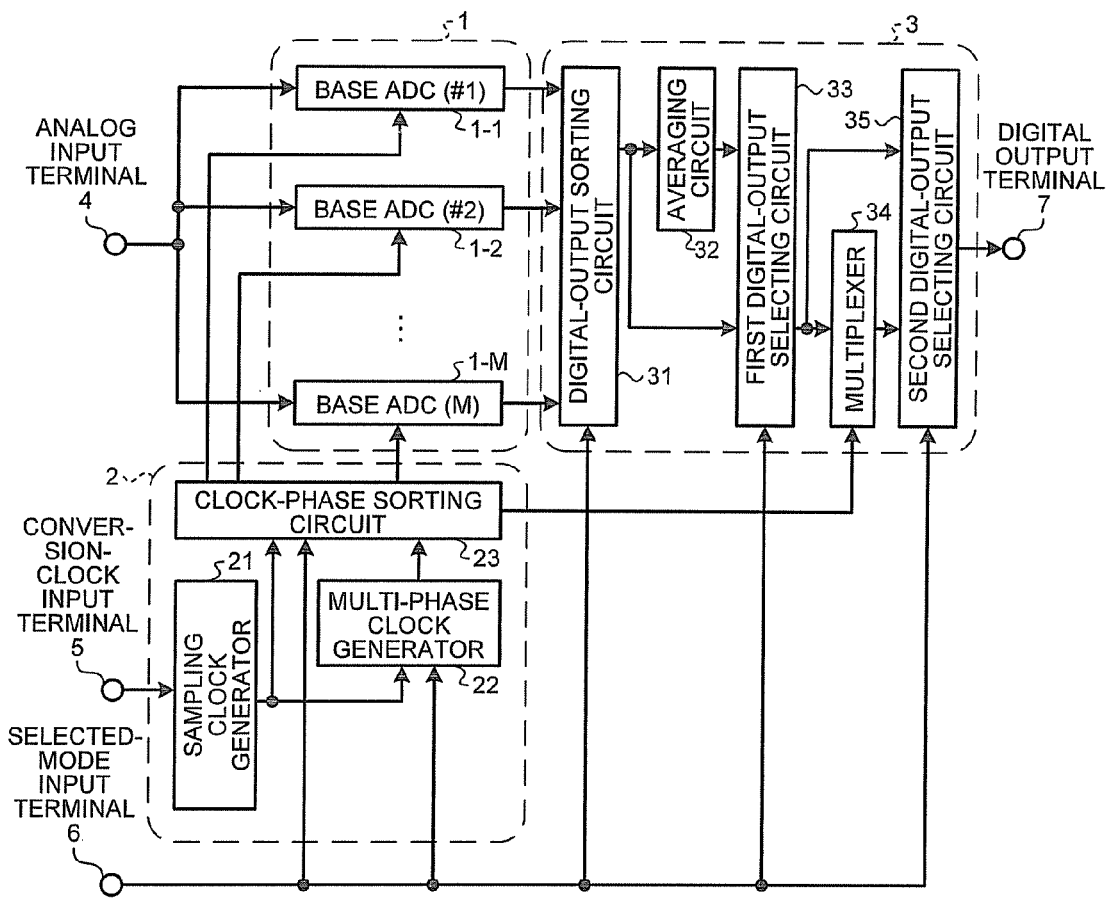
FIG. 1 is a block diagram illustrating a configuration of an analog-to-digital converter (ADC) according to an embodiment.

FIG. 1 is a block diagram illustrating a configuration of an ADC according to an embodiment. As illustrated in FIG. 1, the ADC according to the embodiment includes an ADC unit 1, a clock-phase control unit 2, and a digital-output processing unit 3. The ADC also includes, as input-output terminals, an analog input terminal 4, a conversion-clock input terminal 5, a selected-mode input terminal 6, and a digital output terminal 7.

Although not illustrated in FIG. 1, the ADC according to the embodiment is able to select and specify any one of a plurality of combinations of conversion speed and conversion accuracy by combining execution and non-execution of selecting operation of a predetermined number of control terminals. A selected mode input from outside to the selected-mode input terminal 6 is an operation mode with specific conversion speed and specific conversion accuracy selected and specified by switching operation of the predetermined number of control terminals, and is in a digital code format.

The ADC unit 1 includes a multiple number (M) of base ADCs, i.e., a base ADC (#1) 1-1 to a base ADC (#M) 1-M. The base ADCs 1-1 to 1-M have identical configurations, in each of which an analog signal input in parallel from the analog input terminal 4 is converted to a predetermined-bit digital signal according to a clock supplied from the clock-phase control unit 2 and the digital signal is output to the digital-output processing unit 3.

The clock-phase control unit 2 includes a sampling clock generator 21, a multi-phase clock generator 22, and a clock-phase sorting circuit 23.

The sampling clock generator 21 generates a sampling clock based on a conversion clock input from the conversion-clock input terminal 5, and supplies the sampling clock to the multi-phase clock generator 22 and the clock-phase sorting circuit 23.

The multi-phase clock generator 22 generates the same number of clocks as the number of the base ADCs 1-1 to 1-M, i.e., M, with phases used in the operation mode input from the selected-mode input terminal 6, in synchronization with the sampling clock input from the sampling clock generator 21. The M number of clocks are any one of the cases: all phases are in-phase; all phases are out-of-phase so as to be shifted from one another at a predetermined interval; and the phases are combination of in-phase and out-of-phase.

The clock-phase sorting circuit 23 sorts and supplies the M number of clocks generated by the multi-phase clock generator 22 to the base ADCs 1-1 to 1-M, based on the operation mode input from the selected-mode input terminal 6 and in synchronization with the sampling clock input from the sampling clock generator 21. At this time, all out-of-phase clocks are supplied to a multiplexer 34 of the digital-output processing unit 3, in any case where all phases of clocks used in the operation mode input from the selected-mode input terminal 6 are in-phase, where all the phases of clocks are out-of-phase, and where the phases of clocks are combination of in-phase and out-of-phase.

The digital-output processing unit 3 includes a digital-output sorting circuit 31, an averaging circuit 32, a first digital-output selecting circuit 33, the multiplexer 34 mentioned above, and a second digital-output selecting circuit 35.

The digital-output sorting circuit 31 outputs digital outputs of the ADC unit 1 to either the averaging circuit 32 or the first digital-output selecting circuit 33 in a switching manner based on the operation mode input from the selected-mode input terminal 6. More specifically, in both cases where all the phases of the clocks used in the operation mode input from the selected-mode input terminal 6 are in-phase and where the phases of the clocks are combination of in-phase and out-of-phase, the digital-output sorting circuit 31 supplies the digital outputs of the ADC unit 1 to the averaging circuit 32. In a case where all the phases of the clocks are out-of-phase, the digital-output sorting circuit 31 supplies the digital outputs of the ADC unit 1 to the first digital-output selecting circuit 33.

The averaging circuit 32 performs an averaging process on the digital outputs of the ADC unit 1 input from the digital-output sorting circuit 31, and then outputs the digital outputs to the first digital-output selecting circuit 33.

The first digital-output selecting circuit 33 selects either the outputs from the averaging circuit 32 or the outputs from the digital-output sorting circuit 31 based on the operation mode input from the selected-mode input terminal 6. More specifically, when all the phases of the clocks used in the operation mode input from the selected-mode input terminal 6 are in-phase, the first digital-output selecting circuit 33 selects the outputs from the averaging circuit 32 and outputs the outputs to the second digital-output selecting circuit 35. When all the phases are out-of-phase, the first digital-output selecting circuit 33 selects the outputs from the digital-output sorting circuit 31 and outputs the outputs to the multiplexer 34. When the phases of the clocks used in the operation mode input from the selected-mode input terminal 6 are combination of in-phase and out-of-phase, the first digital-output selecting circuit 33 selects the outputs from the averaging circuit 32, and outputs average data, which is output by the averaging circuit 32 in order at a predetermined interval, to the multiplexer 34 in the same order.

The multiplexer 34 selects the digital outputs of the ADC unit 1 input from the first digital-output selecting circuit 33, in order at a predetermined interval according to an out-of-phase clock input from the clock-phase sorting circuit 23, and outputs the digital outputs to the second digital-output selecting circuit 35.

The second digital-output selecting circuit 35 selects either the outputs from the first digital-output selecting circuit 33 or the outputs from the multiplexer 34 based on the operation mode input from the selected-mode input terminal 6. More specifically, when all the phases of the clocks used in the operation mode input from the selected-mode input terminal 6 are in-phase, the second digital-output selecting circuit 35 selects the outputs from the first digital-output selecting circuit 33 and outputs the outputs to the digital output terminal 7. When all the phases of the clocks used in the operation mode input from the selected-mode input terminal 6 are out-of-phase and when the phases are combination of in-phase and out-of-phase, the second digital-output selecting circuit 35 selects the outputs from the multiplexer 34 and outputs the outputs to the digital output terminal 7.

Figure 2:
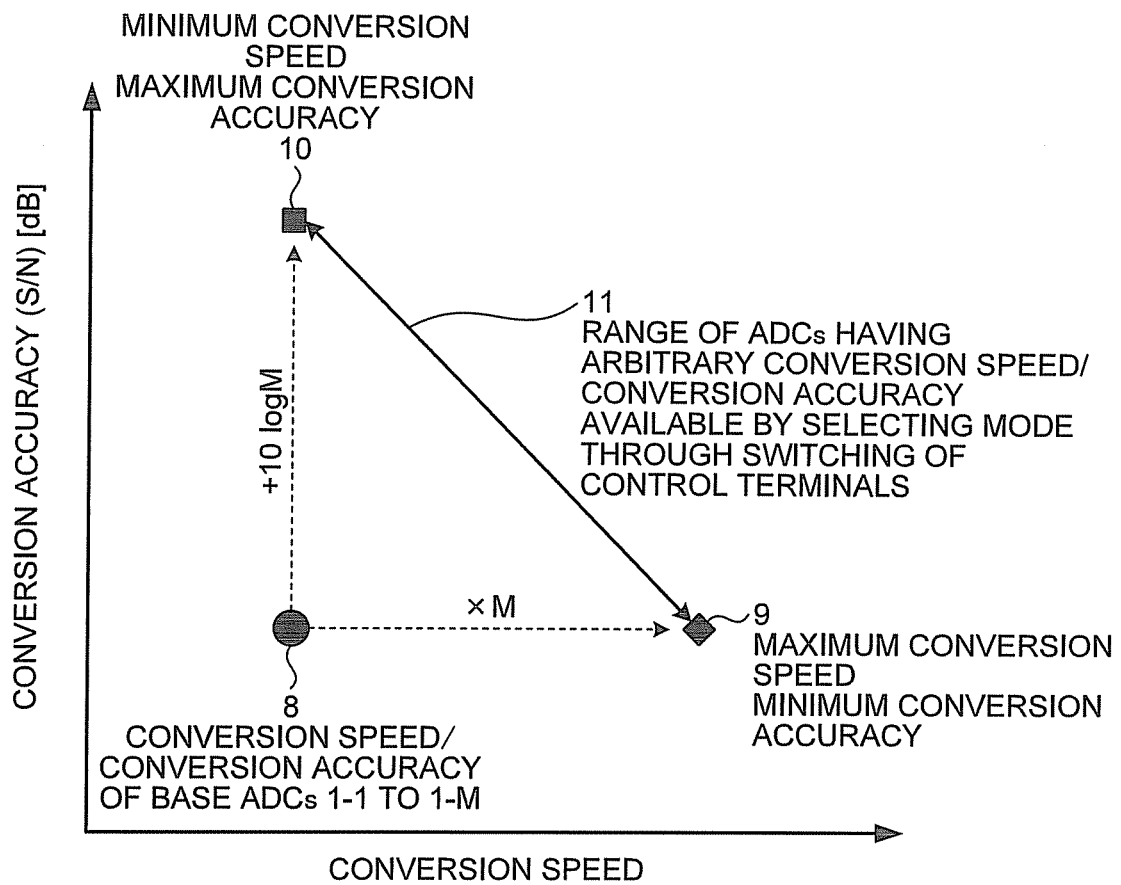
FIG. 2 is a diagram for explaining a range of a plurality of ADCs that can be implemented by the ADC illustrated in FIG. 1.

Next, FIG. 2 is a diagram for explaining a range of a plurality of ADCs that can be implemented by the ADC illustrated in FIG. 1. In FIG. 2, conversion speed/conversion accuracy 8 of the M number of the base ADCs 1-1 to 1-M constituting the ADC unit 1 is conversion speed/conversion accuracy obtained by operating each of the M number of the base ADCs 1-1 to 1-M with an identical conversion frequency fs. In the embodiment, with use of the conversion speed/conversion accuracy 8 of the M number of the base ADCs 1-1 to 1-M and with selection and specification of the operation mode by selection and switching of the control terminals as described above, it is possible to easily form an ADC having maximum conversion speed/minimum conversion accuracy 9, an ADC having minimum conversion speed/maximum conversion accuracy 10, and a plurality of ADCs having arbitrary conversion speed/conversion accuracy in a range 11 between the maximum conversion speed/minimum conversion accuracy 9 and the minimum conversion speed/maximum conversion accuracy 10.

Figure 3:
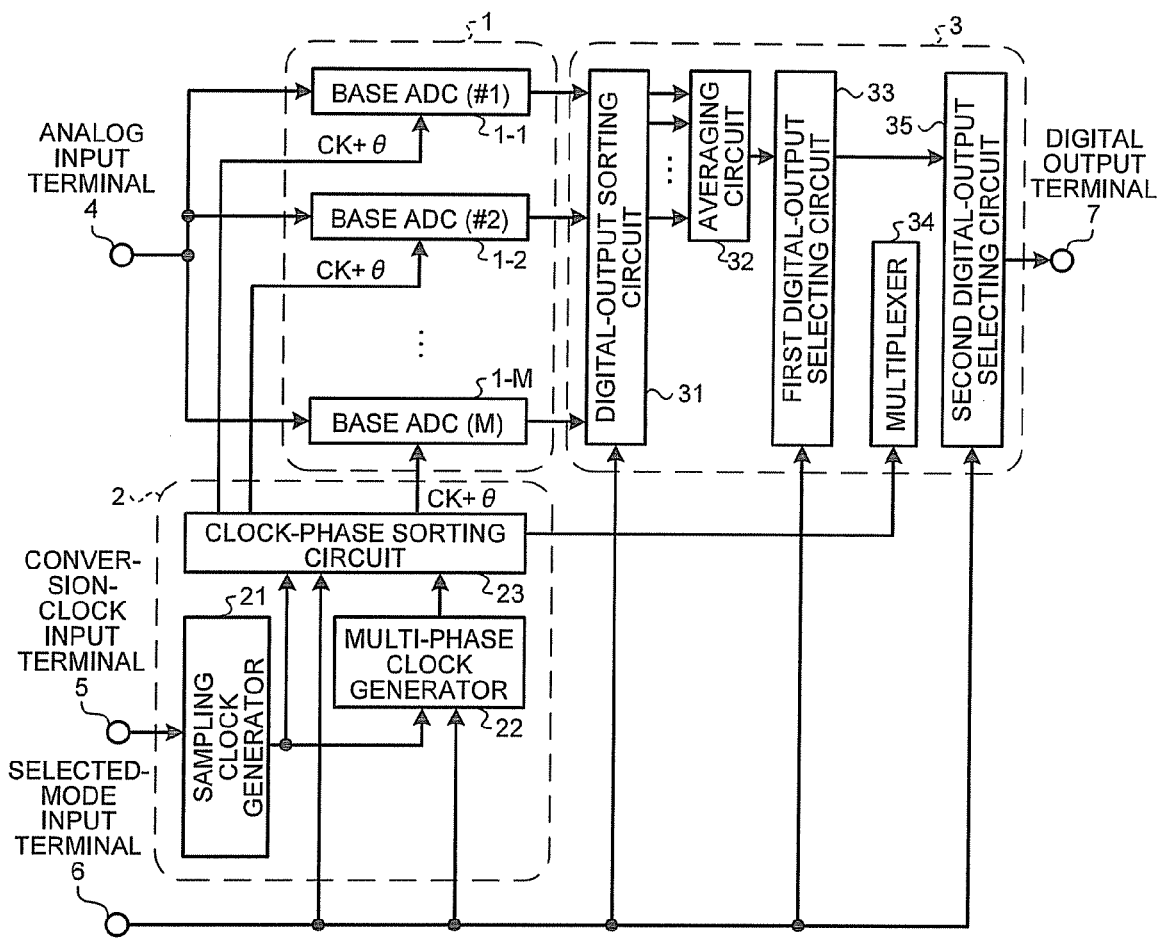
FIG. 3 is a block diagram for explaining a first operation example of the ADC illustrated in FIG. 1.
Figure 4:
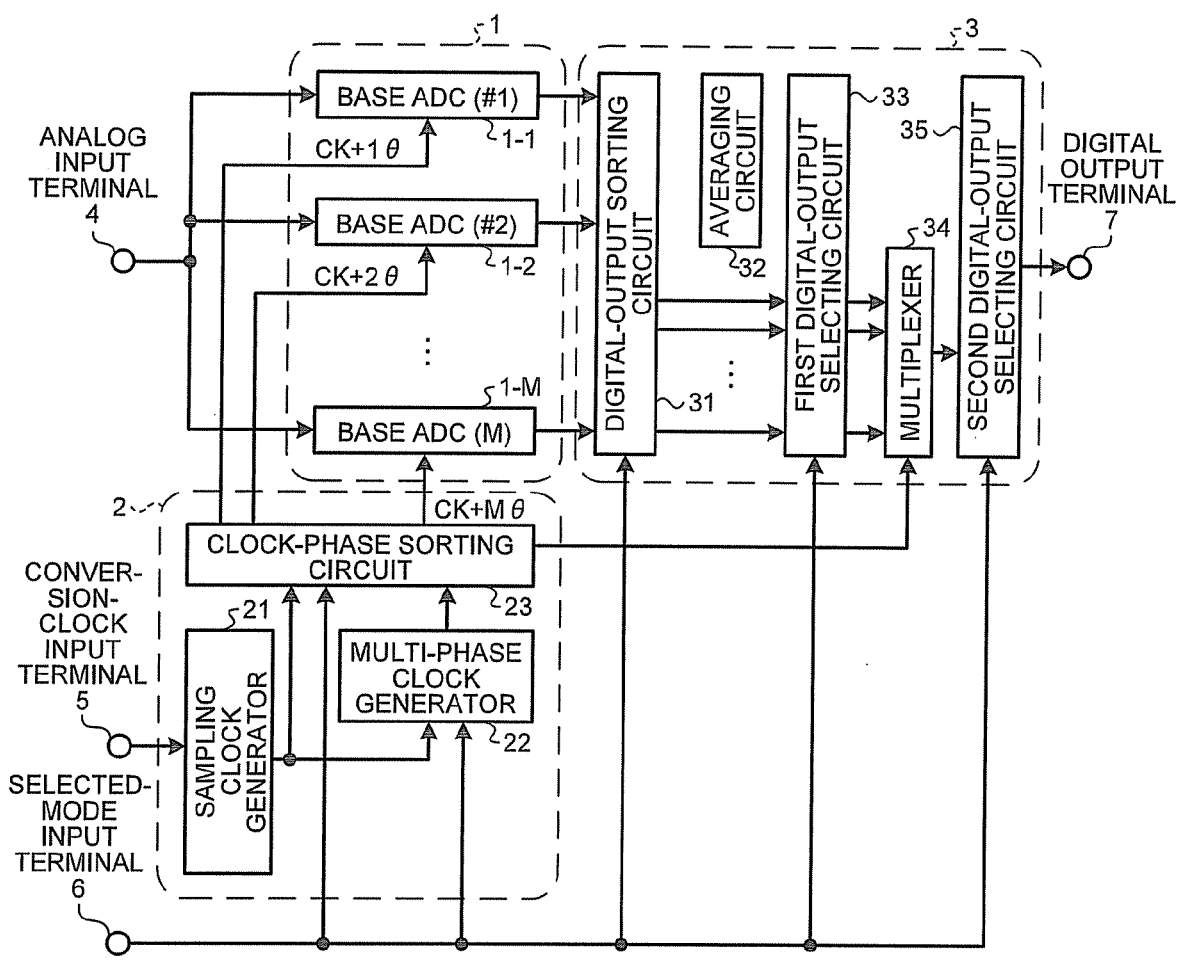
FIG. 4 is a block diagram for explaining a second operation example of the ADC illustrated in FIG. 1.
Figure 5:
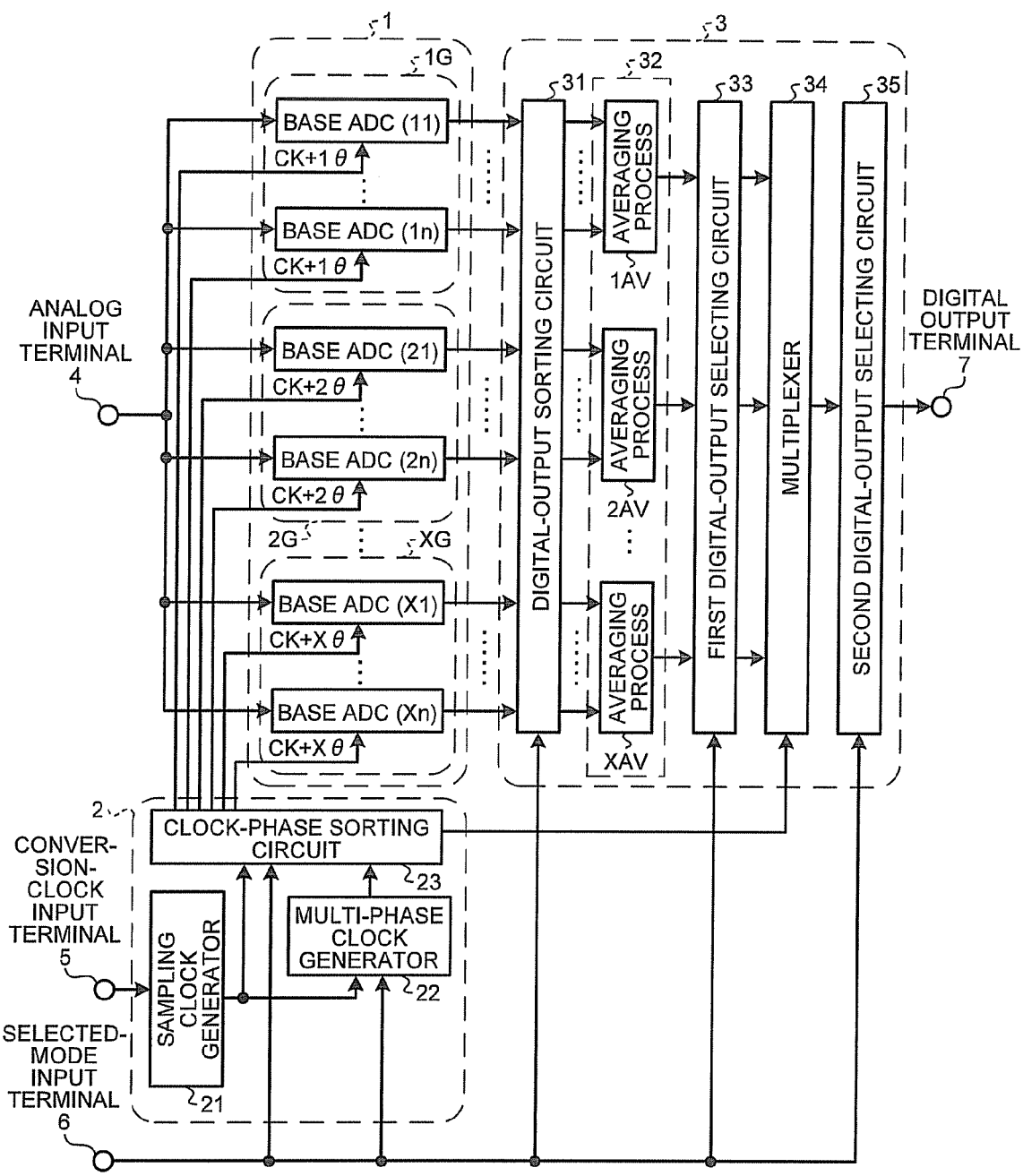
FIG. 5 is a block diagram for explaining third to fifth operation examples of the ADC illustrated in FIG. 1.

This is described in detail below with reference to FIGS. 3 to 5. FIG. 3 is a block diagram for explaining a first operation example of the ADC illustrated in FIG. 1. FIG. 4 is a block diagram for explaining a second operation example of the ADC illustrated in FIG. 1. FIG. 5 is a block diagram for explaining third to fifth operation examples of the ADC illustrated in FIG. 1.

Operation Example 1

An ADC having the minimum conversion speed/maximum conversion accuracy 10 is implemented by an operation form illustrated in FIG. 3. In FIG. 3, when the operation mode input from the selected-mode input terminal 6 specifies ADC operation with minimum conversion speed/maximum conversion accuracy, the multi-phase clock generator 22 in the clock-phase control unit 2 generates the M number of in-phase clocks CK+$\theta$. Then, the clock-phase sorting circuit 23 sorts and supplies the in-phase clocks CK+$\theta$ to the M number of the base ADCs 1-1 to 1-M.

Consequently, in the ADC unit 1, the M number of the base ADCs 1-1 to 1-M perform in-phase conversion operations, so that the M number of in-phase digital signals are output from the ADC unit 1 to the digital-output processing unit 3.

In the digital-output processing unit 3, when the operation mode input from the selected-mode input terminal 6 specifies the ADC operation with the minimum conversion speed/maximum conversion accuracy, the digital-output sorting circuit 31 gives all the digital outputs of the ADC unit 1 to the averaging circuit 32. The first digital-output selecting circuit 33 selects the outputs from the averaging circuit 32 and outputs the outputs. The second digital-output selecting circuit 35 then selects the outputs from the first digital-output selecting circuit 33 and sends the outputs to the digital output terminal 7.

In this case, because all digital outputs of the M number of the base ADCs 1-1 to 1-M that perform the in-phase conversion operations are given as in-phase digital outputs to the averaging circuit 32 and subjected to the averaging process, "other noise power (thermal noise and the like)" in the conversion accuracy (SNR=10 log (input signal power/(quantization noise power+other noise power (thermal noise and the like))) of each of the M number of the base ADCs 1-1 to 1-M is reduced to 1/M by the averaging process. In other words, conversion accuracy SNR (dB) for one ADC becomes SNR (dB)=SNR of the base ADC+10 logM (dB), which is the maximum conversion accuracy in the embodiment. The conversion frequency at this time is remained as the above-mentioned fs, which is the minimum conversion speed in the embodiment.

Operation Example 2

An ADC having the maximum conversion speed/minimum conversion accuracy 9 is implemented by an operation form illustrated in FIG. 4. In FIG. 4, when the operation mode input from the selected-mode input terminal 6 specifies ADC operation with the maximum conversion speed/minimum conversion accuracy, the multi-phase clock generator 22 in the clock-phase control unit 2 generates the M number of out-of-phase clocks CK+1θ to CK+Mθ each of which is shifted by a phase θ, where θ=360°/M. Then, the clock-phase sorting circuit 23 sorts and supplies the out-of-phase clocks CK+1 θ to CK+Mθ to the M number of the base ADCs 1-1 to 1-M.

Consequently, in the ADC unit 1, the M number of the base ADCs 1-1 to 1-M perform interleaved conversion operations at intervals of the phase θ, so that the M number of digital signals are output from the ADC unit 1 to the digital-output processing unit 3 at intervals of the phase θ.

In the digital-output processing unit 3, when the operation mode input from the selected-mode input terminal 6 specifies the maximum conversion speed/minimum conversion accuracy, the digital-output sorting circuit 31 gives all the digital outputs of the ADC unit 1 to the first digital-output selecting circuit 33. The first digital-output selecting circuit 33 selects the outputs from the digital-output sorting circuit 31 and gives the outputs to the multiplexer 34. Then, the second digital-output selecting circuit 35 selects the outputs from the multiplexer 34 and sends the outputs to the digital output terminal 7.

In this case, because all digital outputs of the M number of the base ADCs 1-1 to 1-M that perform the interleaved conversion operations at intervals of the phase θ are given to the multiplexer 34 and subjected to a multiplexing process, conversion speed (the maximum conversion speed in the embodiment) that is M times larger than the conversion frequency fs is obtained. The conversion accuracy (SNR) at this time is equal to the conversion accuracy of each of the M number of the base ADCs 1-1 to 1-M (SNR=10 log (input signal power/(quantization noise power+other noise power (thermal noise and the like))), which is the minimum conversion accuracy in the embodiment.

Operation Example 3

An ADC having arbitrary conversion speed/conversion accuracy in the range 11 between the maximum conversion speed/minimum conversion accuracy 9 and the minimum conversion speed/maximum conversion accuracy 10 is implemented by an operation form illustrated in FIG. 5. An operation example 3a for implementing the operation mode input from the selected-mode input terminal 6, and operation examples 3b and 3c performed along with the operation of the operation example 3a are described below. Regarding the operation examples 3b and 3c, either one of them is implemented in an actual process.

Operation Example 3a

When the operation mode input from the selected-mode input terminal 6 specifies ADC operation with conversion speed/conversion accuracy in the range 11 between the maximum conversion speed/minimum conversion accuracy 9 and the minimum conversion speed/maximum conversion accuracy 10, the multi-phase clock generator 22 in the clock-phase control unit 2 in FIG. 5 divides the M number of the base ADCs 1-1 to 1-M into several groups, and generates clocks such that phases of clocks in the same group are in-phase and phases of clocks are shifted between the groups at a predetermined interval. The clock-phase sorting circuit 23 sorts and supplies the clocks to each of the M number of the base ADCs 1-1 to 1-M. At this time, the clock-phase sorting circuit 23 supplies to the multiplexer 34 the same number of out-of-phase clocks as the groups between which the phases are shifted at a predetermined interval.

Consequently, in the ADC unit 1, the M number of the base ADCs 1-1 to 1-M are divided into a predetermined number of groups, and perform conversion operations per group using a phase different from those of the other groups. Therefore, the digital signals having phases shifted for each group at a predetermined interval are output from the ADC unit 1 to the digital-output processing unit 3.

In the example illustrated in the figure, the M number of the base ADCs 1-1 to 1-M are divided into the X number of groups (a first group 1G to an X-th group XG), and each group is formed of the n number of the base ADCs. That is, M=X·n. A clock phase θ between the groups is θ=360°/X. A clock CK+1θ is supplied to the first group 1G (a base ADC (11) to a base ADC (1n)), a clock CK+2θ is supplied to the second group 2G (a base ADC (21) to a base ADC (2n)), and a clock CK+Xθ is supplied to the X-th group XG (a base ADC (X1) to a base ADC (Xn)). The number of ADCs in each group is not necessarily the same between the groups, and it may be different between the groups or may be the same between some groups and different between other groups. The base ADCs belonging to one group are not necessarily arranged adjacent to each other.

In the digital-output processing unit 3, when the operation mode input from the selected-mode input terminal 6 specifies the ADC operation with the conversion speed/conversion accuracy in the range 11 between the maximum conversion speed/minimum conversion accuracy 9 and the minimum conversion speed/maximum conversion accuracy 10, the digital-output sorting circuit 31 gives digital outputs of each group of the ADC unit 1 to the averaging circuit 32. In the example illustrated in the figure, the averaging circuit 32 sequentially performs averaging processes (1AV to XAV) on the digital outputs from the first group 1G to the X-th group XG, and outputs the digital outputs to the first digital-output selecting circuit 33.

The first digital-output selecting circuit 33 selects the outputs from the averaging circuit 32 and gives the outputs to the multiplexer 34. The multiplexer 34 sequentially outputs the X number of process results of the averaging processes (1AV to XAV) to the second digital-output selecting circuit 35 according to the X number of out-of-phase clocks supplied from the clock-phase sorting circuit 23 and whose phases are shifted at a predetermined interval. The second digital-output selecting circuit 35 selects the outputs from the multiplexer 34 and sends the outputs to the digital output terminal 7. In this manner, a plurality of ADCs having arbitrary conversion speed/conversion accuracy is obtained.

When the M number of the base ADCs 1-1 to 1-M are used by dividing them into groups, and if characteristics variation occurs between the base ADCs, conversion accuracy may become different between the groups. Therefore, in the embodiment, when the operation of the operation example 3a is performed as described above, the multi-phase clock generator 22 and the clock-phase sorting circuit 23 of the clock-phase control unit 2 control the phases of the clocks supplied to the ADC unit 1 according to settings, so that one of the following operation examples 3b and 3c can be performed.

Operation Example 3b

In FIG. 5, every time one conversion operation by the M number of the base ADCs 1-1 to 1-M is finished, the multi-phase clock generator 22 of the clock-phase control unit 2 dynamically changes (i.e., without causing intervals between the conversion operations by the M number of the base ADCs 1-1 to 1-M) a precedence/delay relation of clock phases between the groups that supply in-phase clocks, without changing structures of the groups.

OPERATION EXAMPLE 3c

In FIG. 5, every time one conversion operation by the M number of the base ADCs 1-1 to 1-M is finished, the multi-phase clock generator 22 of the clock-phase control unit 2 dynamically changes (i.e., without causing intervals between the conversion operations by the M number of the base ADCs 1-1 to 1-M) the number of in-phase clocks to be supplied, without changing the number of the groups that supply the in-phase clocks.

In this manner, because an order of operations between the groups is changed in the operation example 3b and the number of components in the groups is changed in the operation example 3c, a conversion accuracy error between the groups can be distributed in each example. Therefore, the conversion accuracy error between the groups can be reduced.

As described above, according to the embodiment, it is possible to easily form a plurality of ADCs having arbitrary conversion speed and conversion accuracy in a switching manner only by selecting and specifying the control terminals. Therefore, it is possible to flexibly cope with specification required for ADCs with various conversion speed and conversion accuracy. In this case, main components needed to be developed are only a plurality of base ADCs having the same conversion capability for forming an ADC unit, and most of the other components can be implemented by using existing circuits. Therefore, development costs and development periods can greatly be reduced.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. An analog-to-digital converter (ADC) comprising:
an ADC unit that includes a plurality of base ADCs that convert input analog signals to digital signals in parallel;
a clock-phase control unit that controls phases of clocks supplied to the plurality of base ADCs according to specified conversion speed and specified conversion accuracy; and
a digital-output processing unit that includes an averaging circuit that obtains average data of input digital signals and a multiplexer that outputs the input digital signals in a predetermined order at a predetermined interval, digital outputs of the ADC unit being input to either the averaging circuit or the multiplexer depending on the specified conversion speed and the specified conversion accuracy, or input to the averaging circuit and the multiplexer in this order, thereby outputting ADC digital signals with the specified conversion speed and the specified conversion accuracy.

2. The analog-to-digital converter according to claim 1, wherein when the specified conversion speed and the specified conversion accuracy are minimum conversion speed and maximum conversion accuracy,
the clock-phase control unit supplies in-phase clocks to all the plurality of base ADCs, and
the digital-output processing unit causes the averaging circuit to process all the digital outputs of the ADC unit.

3. The analog-to-digital converter according to claim 1, wherein when the specified conversion speed and the specified conversion accuracy are maximum conversion speed and minimum conversion accuracy,
the clock-phase control unit supplies clocks shifted at a predetermined interval to each of the plurality of base ADCs, and supplies all the clocks shifted at the predetermined intervals to the multiplexer, and
the digital-output processing unit causes the multiplexer to process all the digital outputs of the ADC unit.

4. The analog-to-digital converter according to claim 1, wherein when the specified conversion speed and the specified conversion accuracy are in a range between a pair of minimum conversion speed and maximum conversion accuracy and a pair of maximum conversion speed and minimum conversion accuracy,
the clock-phase control unit divides the plurality of base ADCs into several groups, supplies clocks to each of the plurality of base ADCs, the clocks having phases such that phases in a same group are all in-phase and phases are shifted between the groups at a predetermined interval, and supplies a same number of clocks as the groups between which the phases are shifted at the predetermined intervals to the multiplexer of the digital-output processing unit, and
the digital-output processing unit causes the averaging circuit to process digital outputs for each group of the ADC unit, and causes the multiplexer to process average data obtained by an averaging process per group.

5. The analog-to-digital converter according to claim 1, wherein when the specified conversion speed and the specified conversion accuracy are in a range between a pair of minimum conversion speed and maximum conversion accuracy and a pair of maximum conversion speed and minimum conversion accuracy,
the clock-phase control unit divides the plurality of base ADCs into several groups, supplies clocks to each of the plurality of base ADCs, the clocks having phases such that phases in a same group are all in-phase and phases are shifted between the groups at a predetermined interval, supplies a same number of clocks as the groups between which the phases are shifted at the predetermined intervals to the multiplexer of the digital-output processing unit, and at this time, every time one conversion operation by the plurality of base ADCs is finished, dynamically changes a precedence/delay relation of clock phases between groups that supply in-phase clocks, without changing structures of the groups, and
the digital-output processing unit causes the averaging circuit to process digital outputs for each group of the ADC unit, and causes the multiplexer to process average data obtained by an averaging process per group.

6. The analog-to-digital converter according to claim 1, wherein when the specified conversion speed and the specified conversion accuracy are in a range between a pair of minimum conversion speed and maximum conversion accuracy and a pair of maximum conversion speed and minimum conversion accuracy,
the clock-phase control unit divides the plurality of base ADCs into several groups, supplies clocks to each of the plurality of base ADCs, the clocks having phases such that phases in a same group are all in-phase and phases are shifted between the groups at a predetermined interval, supplies a same number of clocks as the groups between which the phases are shifted at the predetermined intervals to the multiplexer of the digital-output processing unit, and at this time, every time one conversion operation by the plurality of base ADCs is finished, dynamically changes number of in-phase clocks to be supplied, without changing number of groups that supply the in-phase clocks, and the digital-output processing unit causes the averaging circuit to process digital outputs for each group of the ADC unit, and causes the multiplexer to process average data obtained by an averaging process per group.

7. The analog-to-digital converter according to claim 1, wherein the plurality of base ADCs operate with an identical conversion frequency, and have substantially same conversion accuracy.

8. The analog-to-digital converter according to claim 1, wherein specifications of the conversion speed and the conversion accuracy are input in digital code formats indicating specific conversion speed and specific conversion accuracy selected and specified by switching operation of a predetermined number of control terminals.

9. The analog-to-digital converter according to claim 1, wherein the clock-phase control unit includes a sampling clock generator that generates a sampling clock based on an input conversion clock;

a multi-phase clock generating circuit that generates clocks to be applied to the plurality of base ADCs, the clocks being generated such that all phases are in-phase, all phases are out-of-phase so as to be shifted from one another at a predetermined interval, or the phases are combination of in-phase and out-of-phase, in synchronization with the sampling clock input from the sampling clock generator and based on the specified conversion speed and the specified conversion accuracy, when generating the clocks such that the phases are combination of in-phase and out-of-phase, divides the plurality of base ADCs into several groups, and generates clocks such that phases in a same group are all in-phase and phases between the groups are shifted at a predetermined interval; and a clock-phase sorting circuit that sorts and supplies the clocks, which are input from the multi-phase clock generating circuit, to the plurality of base ADCs, in synchronization with the sampling clock input from the sampling clock generator and based on the specified conversion speed and the specified conversion accuracy, and supplies all out-of-phase clocks among the clocks input from the multi-phase clock generating circuit to the multiplexer of the digital-output processing circuit, when phases of clocks used with the specified conversion speed and the specified conversion accuracy are out-of-phase or when the phases are combination of in-phase and out-of-phase.

10. The analog-to-digital converter according to claim 1, wherein the clock-phase control unit includes a sampling clock generator that generates a sampling clock based on an input conversion clock;

a multi-phase clock generating circuit that generates clocks to be applied to the plurality of base ADCs, the clocks being generated such that all phases are in-phase, all phases are out-of-phase so as to be shifted from one another at a predetermined interval, or the phases are combination of in-phase and out-of-phase, in synchronization with the sampling clock input from the sampling clock generator and based on the specified conversion speed and the specified conversion accuracy, when generating the clocks such that the phases are combination of in-phase and out-of-phase, divides the plurality of base ADCs into several groups, and generates clocks such that phases in a same group are all in-phase and phases between the groups are shifted at a predetermined interval; and a clock-phase sorting circuit that sorts and supplies the clocks, which are input from the multi-phase clock generating circuit, to the plurality of base ADCs, in synchronization with the sampling clock input from the sampling clock generator and based on the specified conversion speed and the specified conversion accuracy, supplies all out-of-phase clocks among the clocks input from the multi-phase clock generating circuit to the multiplexer of the digital-output processing circuit, when phases of clocks used with the specified conversion speed and the specified conversion accuracy are out-of-phase or when the phases are combination of in-phase and out-of-phase, and at this time, when the phases of the clocks used with the specified conversion speed and the specified conversion accuracy are combination of in-phase and out-of-phase, dynamically changes clock phases between groups that supply in-phase clocks, without changing structures of the groups, every time one conversion operation by the plurality of base ADCs is finished.

11. The analog-to-digital converter according to claim 1, wherein the clock-phase control unit includes a sampling clock generator that generates a sampling clock based on an input conversion clock;

a multi-phase clock generating circuit that generates clocks to be applied to the plurality of base ADCs, the clocks being generated such that all phases are in-phase, all phases are out-of-phase so as to be shifted from one another at a predetermined interval, or the phases are combination of in-phase and out-of-phase, in synchronization with the sampling clock input from the sampling clock generator and based on the specified conversion speed and the specified conversion accuracy, when generating the clocks such that the phases are combination of in-phase and out-of-phase, divides the plurality of base ADCs into several groups, and generates clocks such that phases in a same group are all in-phase and phases between the groups are shifted at a predetermined interval; and a clock-phase sorting circuit that sorts and supplies the clocks, which are input from the multi-phase clock generating circuit, to the plurality of base ADCs, in synchronization with the sampling clock input from the sampling clock generator and based on the specified conversion speed and the specified conversion accuracy, supplies all out-of-phase clocks among the clocks input from the multi-phase clock generating circuit to the multiplexer of the digital-output processing circuit, when phases of clocks used with the specified conversion speed and the specified conversion accuracy are out-of-phase or when the phases are combination of in-phase and out-of-phase, and at this time, when the phases of the clocks used with the specified conversion speed and the specified conversion accuracy are combination of in-phase and out-of-phase, dynamically changes number of in-phase clocks to be supplied, without changing number of groups that supply the in-phase clocks, every time one conversion operation by the plurality of base ADCs is finished.

12. The analog-to-digital converter according to claim 1, wherein the digital-output processing unit includes a digital-output sorting circuit that supplies digital outputs of the plurality of base ADCs to the averaging circuit in parallel when the phases of clocks used with the specified conversion speed and the specified conversion accuracy are all in-phase, supplies digital outputs for each of the groups of the plurality of base ADCs to the averaging circuit in sequence when the phases are combination of in-phase and out-of-phase, and supplies digital outputs of the plurality of base ADCs to a first digital-output selecting circuit in sequence when the phases are all out-of-phase;

the first digital-output selecting circuit that selects outputs from the averaging circuit and outputs the outputs to a second digital-output selecting circuit when the phases of the clocks used with the specified conversion speed and the specified conversion accuracy are all in-phase, selects outputs from the digital-output sorting circuit and outputs the outputs to the multiplexer when the phases are all out-of-phase, and sequentially selects average data output by the averaging circuit at a predetermined interval and outputs the average data to the multiplexer when the phases are combination of in-phase and out-of-phase; and the second digital-output selecting circuit that selects outputs from the first digital-output selecting circuit and sends the outputs to a digital output terminal when the phases of the clocks used with the specified conversion speed and the specified conversion accuracy are all in-phase, and selects outputs from the multiplexer and sends the outputs to the digital output terminal when the phases are all out-of-phase or when the phases are combination of in-phase and out-of-phase.

* * * * *